(12) United States Patent
Yamashita

(10) Patent No.: US 12,347,998 B2
(45) Date of Patent: Jul. 1, 2025

(54) METHOD OF MANUFACTURING METAL-COATED MEMBER, METAL-COATED MEMBER, WAVELENGTH CONVERSION MEMBER, AND LIGHT EMITTING DEVICE

(71) Applicant: NICHIA CORPORATION, Anan (JP)

(72) Inventor: Toshiaki Yamashita, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 69 days.

(21) Appl. No.: 17/339,439

(22) Filed: Jun. 4, 2021

(65) Prior Publication Data

US 2021/0384699 A1    Dec. 9, 2021

(30) Foreign Application Priority Data

Jun. 5, 2020  (JP) ................................ 2020-098157

(51) Int. Cl.
*F21V 21/04*    (2006.01)
*C04B 37/00*    (2006.01)
*C04B 41/45*    (2006.01)
*C04B 41/88*    (2006.01)
*F21V 7/04*    (2006.01)
(Continued)

(52) U.S. Cl.
CPC .......... *H01S 5/0087* (2021.01); *C04B 37/006* (2013.01); *C04B 41/4505* (2013.01); *C04B 41/88* (2013.01); *F21V 7/04* (2013.01); *F21Y 2115/30* (2016.08)

(58) Field of Classification Search
CPC ....................................................... F21V 7/04
See application file for complete search history.

(56) References Cited

U.S. PATENT DOCUMENTS 4,501,768 A    2/1985  Kumar
4,504,322 A    3/1985  Adwalpalker et al.
(Continued)

FOREIGN PATENT DOCUMENTS

JP    S56-111700 A    9/1981
JP    S58-168265 A    10/1983
(Continued)

OTHER PUBLICATIONS

JP 2004-196633 A Translation, generated on Apr. 19, 2023 with J-Plat Pat website (https://www.j-platpat.inpit.go.jp/).*
(Continued)

*Primary Examiner* — Humera N. Sheikh
*Assistant Examiner* — Julia L Rummel
(74) *Attorney, Agent, or Firm* — Foley & Lardner LLP

(57) ABSTRACT

A method of manufacturing a metal-coated member includes: providing a composite ceramic member including a ceramic part, and a connection part connected to the ceramic part; disposing a precious metal layer on a surface region that includes at least a portion of a surface of the ceramic part and a portion of a surface of the connection part, the precious metal layer including a precious metal; and removing at least a portion of the precious metal layer that is on the surface of the ceramic part and delineated by the boundary between the ceramic part and the connection part. The connection part has stronger adhesion to the precious metal than the ceramic part.

6 Claims, 7 Drawing Sheets

(51) Int. Cl.
 *H01S 5/00* (2006.01)
 *F21Y 115/30* (2016.01)

(56) References Cited

U.S. PATENT DOCUMENTS

| | | | |
|---|---|---|---|
| 2005/0162811 A1* | 7/2005 | Obi | G02B 6/3584 |
| | | | 361/437 |
| 2005/0287721 A1 | 12/2005 | Yamamoto et al. | |
| 2013/0098438 A1* | 4/2013 | Kawai | H01L 31/0203 |
| | | | 257/432 |
| 2013/0250544 A1* | 9/2013 | Zink | H01L 33/505 |
| | | | 359/326 |
| 2013/0285091 A1 | 10/2013 | Akimoto et al. | |
| 2017/0155022 A1* | 6/2017 | Tomonari | H10H 20/813 |
| 2019/0081452 A1* | 3/2019 | Miura | H01S 5/02255 |

FOREIGN PATENT DOCUMENTS

| | | | |
|---|---|---|---|
| JP | S59-101897 A | | 6/1984 |
| JP | 2004196633 A | * | 7/2004 |
| JP | 2006-049847 A | | 2/2006 |
| JP | 2009-265392 A | | 11/2009 |
| JP | 2013-232539 A | | 11/2013 |
| JP | 2016-001750 A | | 1/2016 |
| JP | 2016-094320 A | | 5/2016 |
| JP | 2019-053130 A | | 4/2019 |

OTHER PUBLICATIONS

Rampinelli S.P.A. "Roughness Conversion Chart", 2019, p. 1, Accessed at https://web.archive.org/web/20190214182430/http://rampinelli.eu/wp-content/uploads/2018/01/Roughness-Conversion-Chart-Rampinelli.pdf.*

* cited by examiner

METHOD OF MANUFACTURING METAL-COATED MEMBER, METAL-COATED MEMBER, WAVELENGTH CONVERSION MEMBER, AND LIGHT EMITTING DEVICE

CROSS-REFERENCE TO RELATED APPLICATION

This application claims priority to Japanese Patent Application No. 2020-098157, filed on Jun. 5, 2020, the disclosure of which is hereby incorporated by reference in its entirety.

BACKGROUND

The present invention relates to a method of manufacturing a metal-coated member, a metal-coated member, a wavelength conversion member, or a light emitting device.

Techniques for depositing a metal on a certain portion of a surface for light shielding purposes have been known. Japanese Patent Publication No. 2013-232539 discloses a method that includes forming a light shielding metal layer on the upper face of a phosphor layer followed by partially removing the light shielding layer.

SUMMARY

In the case of disposing a metal layer on a certain part of a surface, it is desirable to precisely form the metal layer in the required location. One of the purposes of the present disclosure is to dispose a metal layer in a desired location of a surface with high precision.

A method of manufacturing a metal-coated member disclosed in the description includes: providing a composite ceramic member including a ceramic part and a connection part connected to the ceramic part, wherein the connection part has stronger adhesion to a precious metal than the ceramic part; disposing a precious metal layer on a surface region that includes at least a portion of a surface of the ceramic part and a portion of a surface of the connection part; and removing a portion of the precious metal layer disposed on the ceramic part and the connection part, wherein the precious metal layer on the surface of the ceramic part delineated by the boundary between the ceramic part and the connection part is removed.

A metal-coated member disclosed in the description includes a ceramic part, a connection part connected to the ceramic part, and a precious metal layer formed on a surface of the connection part along a boundary between the ceramic part and the connection part. The surface of the connection part delineated by the boundary has stronger adhesion to the precious metal than a surface of the ceramic part.

A metal-coated member disclosed in the description a first ceramic part, a second ceramic part connected to the first ceramic part, and a precious metal layer formed on a surface of the second ceramic part along a boundary between the first ceramic part and the second ceramic part. A surface roughness Rz of the surface of the second ceramic part on which the precious metal layer is formed is at least 0.10 μm.

According to the present disclosure, a member having a metal layer formed on the surface thereof with high precision can be obtained.

DETAILED DESCRIPTION

Figure 1:
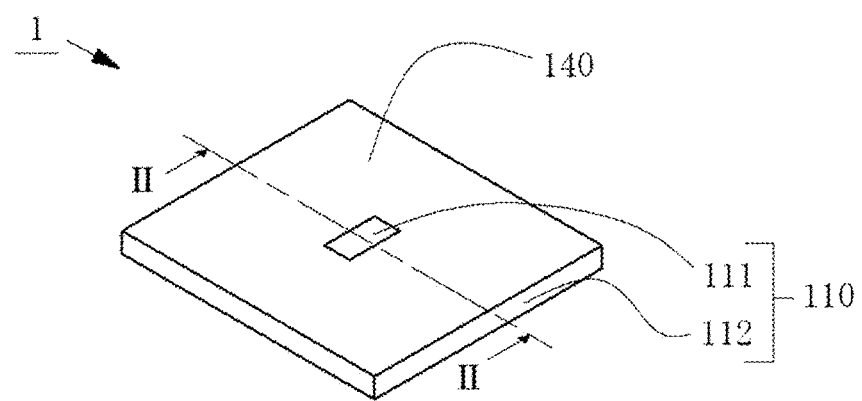
FIG. 1 is a perspective view of a metal-coated member according to one embodiment.

In the description or the accompanying claims, a polygon, such as a triangle, rectangle, or the like, including a shape subjected to processing, such as cutting angles, chamfering, beveling, rounding, or the like, will be referred to as a polygon. Moreover, the location of such processing is not limit to a corner (an end of a side). Rather, a shape subjected to processing in the middle of a side will similarly be referred to as a polygon. In other words, any polygon-based shape subjected to processing should be understood to be included in the interpretation of a "polygon" in the description and the accompanying claims.

This applies to not only polygons, but also any word that describes a specific shape, such as a trapezoidal, circular, recessed, depressed, protruding or projected shape. This also applies when handling each side of a shape. In other words, even if a side is subjected to processing at a corner or in the middle, the interpretation of a "side" includes the processed portion. In the case of distinguishing a "polygon" or "side" that has been intentionally not processed from a processed shape, it will be expressed with the word, "exact," added thereto, for example, an "exact rectangle."

In the description or the accompanying claims, expressions such as up/down, left/right, front/back, forward/rearward, forepart/rear part, or the like merely describe the relative positions, orientations, or directions, and do not have to be matched by those in use. For example, if the upper face of a part is implemented so as to become a lateral face of a finished product, the upper face of the part remains as the upper face for that part.

In the description or the accompanying claims, moreover, when there are multiple pieces of a certain component and a distinction must be made, a word such as "first," "second," or the like might occasionally be added. The manner in which such a word is used in the description might not match the manner in which such a word is used in the claims if the subject to be distinguished or the perspective for such a distinction differs.

For example, in the case in which there are a plurality of elements denoted and distinguished by "first," "second," and "third" in the description, and a certain claim recites only those that are referred to as the "first" and "third" in the description for comprehensible purpose, what are referred to as the "first" and "second" in the claim might correspond to what are referred to as the "first" and "third" in the description.

Certain embodiments of the present invention will be explained below with reference to the drawings. The embodiments described below are provided to give shape to the technical ideas of the present invention, and are not intended to limit the present invention. In the explanation below, the same designations and reference numerals denote the same or similar members, for which a redundant explanation will be omitted as appropriate. The sizes and relative positions of the members shown in the drawings might be exaggerated for clarity of explanation.

Figure 2:
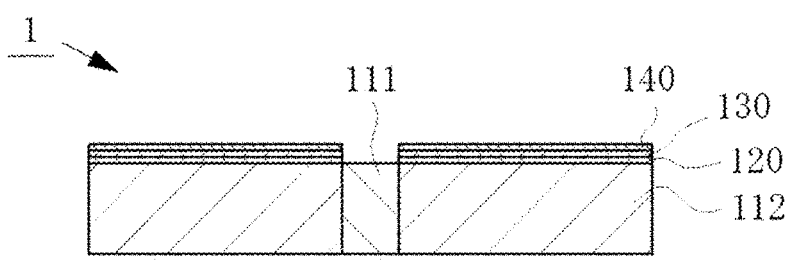
FIG. 2 is a cross-sectional view of the metal-coated member taken along line II-II in FIG.

FIG. 1 is a perspective view of an example of a metal-coated member 1 according to one embodiment. FIG. 2 is a cross-sectional view of the metal-coated member 1 taken along line II-II in FIG. 1. FIG. 3A, FIG. 3B, FIG. 3C, and FIG. 3D are cross-sectional views explaining a method of manufacturing the metal-coated member 1. FIG. 4A to FIG. 4D are TEM (transmission electron microscope) images of the metal-coated member 1.

Figure 5:
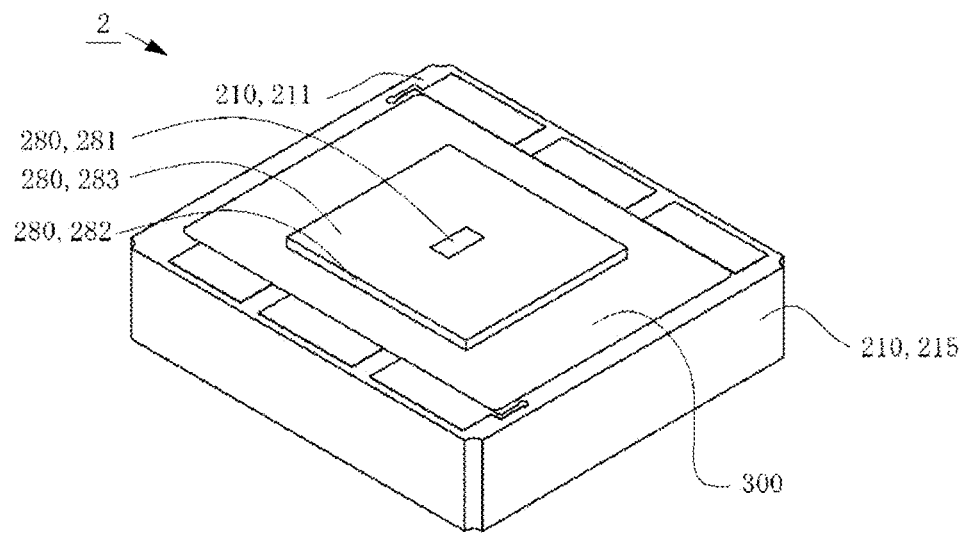
FIG. 5 is a perspective view of a light emitting device according to one embodiment.
Figure 6:
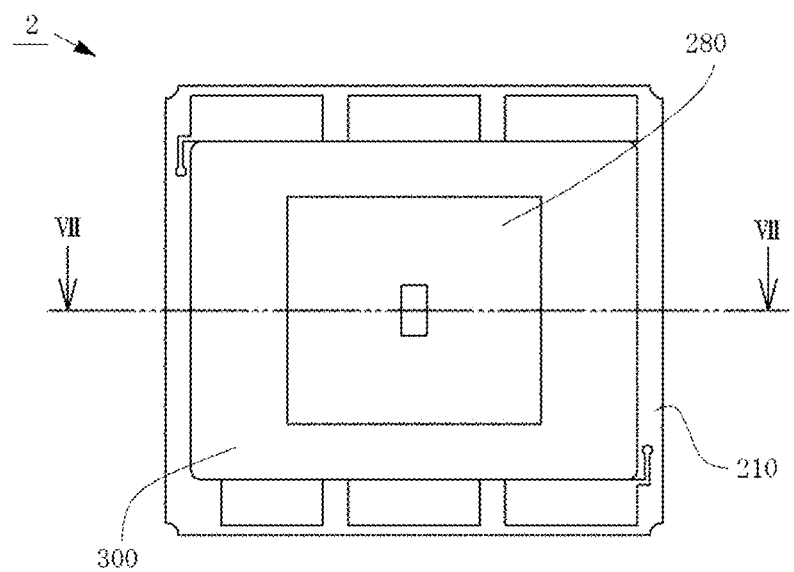
FIG. 6 is a top view corresponding to FIG. 5.
Figure 7:
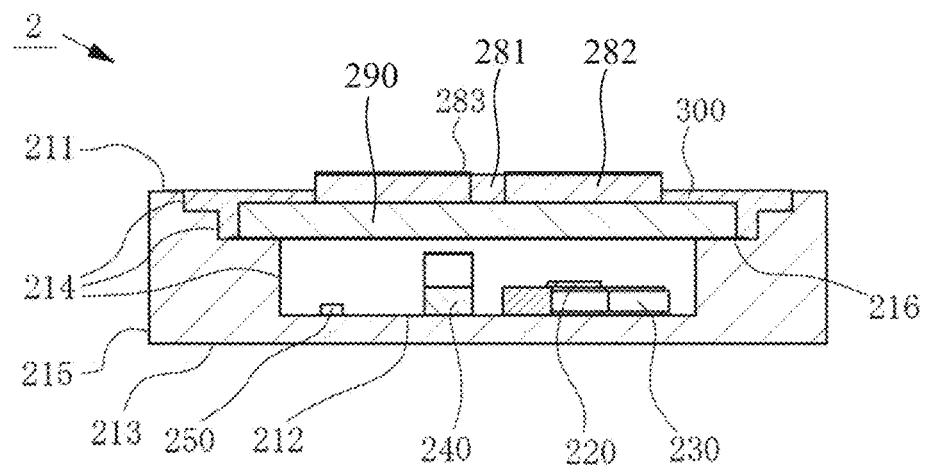
FIG. 7 is a cross-sectional view of the light emitting device taken along line VII-VII in FIG. 6.
Figure 8:
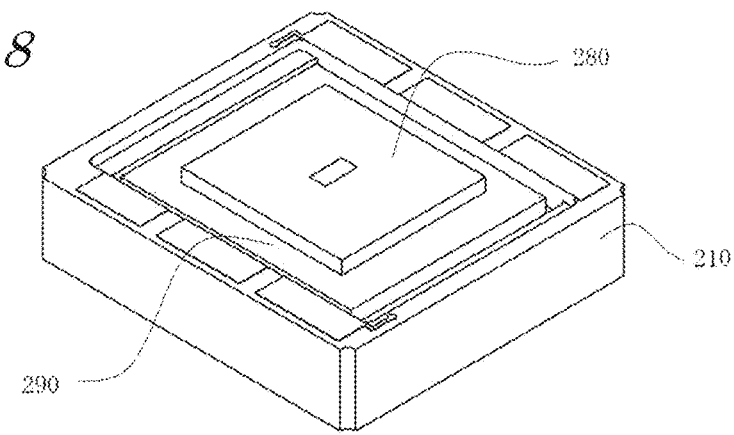
FIG. 8 is a perspective view explaining the internal structure of the light emitting device according to the embodiment.
Figure 9:
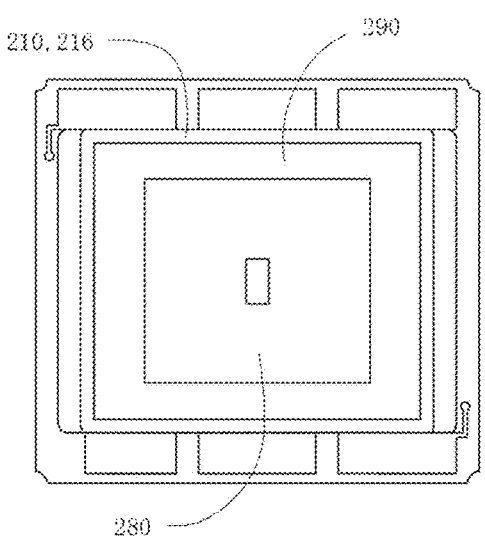
FIG. 9 is a top view corresponding to FIG. 8.
Figure 10:
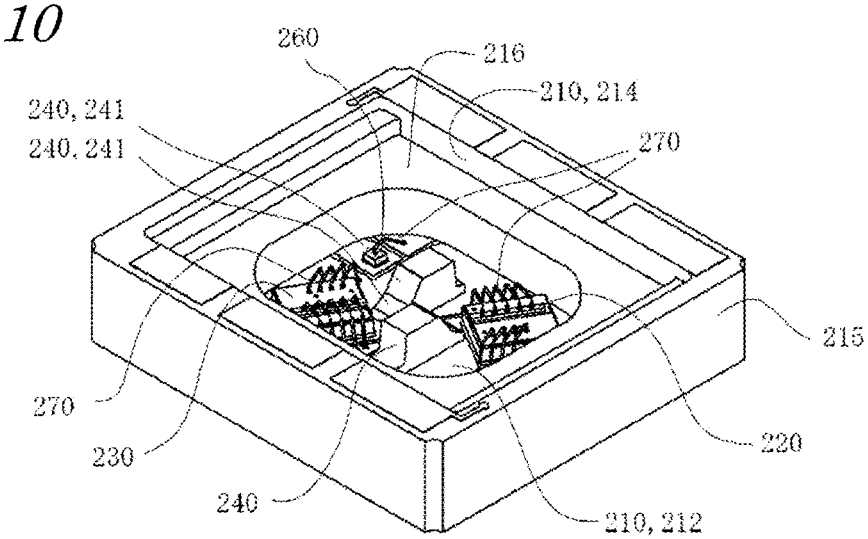
FIG. 10 is a perspective view explaining the internal structure of the light emitting device according to the embodiment.
Figure 11:
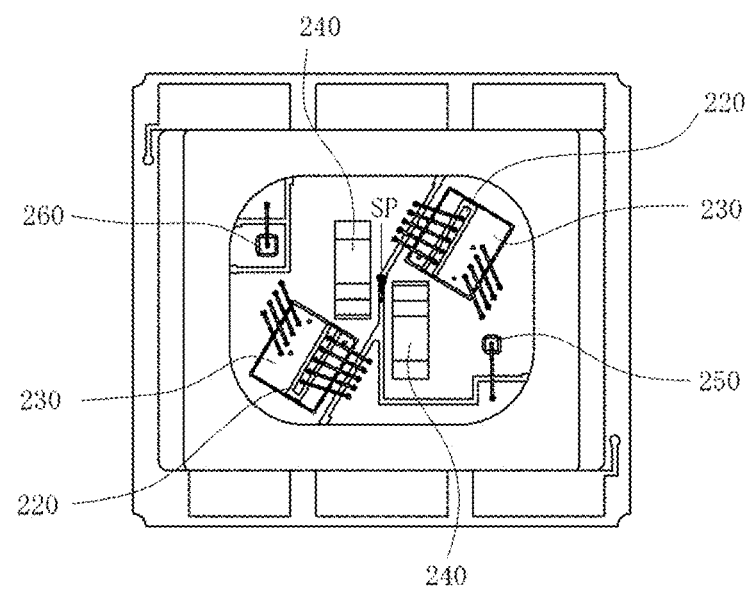
FIG. 11 is a top view corresponding to FIG. 10.

FIG. 5 is a perspective view of an example of a light emitting device 2 according to one embodiment. FIG. 6 is a top view of the light emitting device 2. FIG. 7 is a cross-sectional view of the light emitting device 2 taken along line VII-VII in FIG. 6. FIG. 8 is a perspective view of the light emitting device 2 from which the light shielding member 300 is removed for explaining the internal structure. FIG. 9 is a top view in the same state as in FIG. 8. FIG. 10 is a perspective view of the light emitting device 2 from which the light transmissive member 290 and the wavelength conversion member 280 are further removed for explaining the internal structure. FIG. 11 is a top view in the same state as in FIG. 10.

A metal-coated member 1 according to one embodiment will be explained first, and a light emitting device 2 produced by including the metal-coated member 1 according to the embodiment as a constituent element will subsequently be explained.

A metal-coated member 1 has constituent elements including a composite ceramic member 110, a precious metal layer 120, a metal layer 130, and a black layer 140. The metal-coated member 1 includes at least a composite ceramic member 110 and a precious metal layer 120.

Each constituent element of a metal-coated member 1 will be explained.

Composite Ceramic Member 110

A composite ceramic member 110 includes as constituent elements a ceramic part 111 and a connection part 112. The composite ceramic member 110 has an upper face, a lower face, and lateral face(s). The composite ceramic member 110 is formed to have a flat plate shape. The composite ceramic member 110 is formed to have a rectangular cuboid shape. The composite ceramic member 110 is formed to have a quadrilateral shape in a top or bottom view. The quadrilateral shape may be a square, for example.

At the upper face of the composite ceramic member 110, the ceramic part 111 and the connection part 112 are contiguous. At the lower face of the composite ceramic member 110, the ceramic part 111 and the connection part 112 are contiguous. At the lateral faces of the composite ceramic member 110, the connection part 112 is exposed, but the ceramic part 111 is not exposed. Accordingly, the ceramic part 111 and the connection part 112 are not contiguous in the lateral faces of the composite ceramic member 110.

At the upper face of the composite ceramic member 110, the ceramic part 111 is surrounded by the connection part 112. In the lower face of the composite ceramic member 110, the ceramic part 111 is surrounded by the connection part 112. The shape and the size of the area where the ceramic part 111 is exposed in the upper face of the composite member 110 are the same as those of the area where the ceramic part 111 is exposed in the lower face of the composite member 110.

The ceramic part 111 has an upper face, a lower face, and lateral faces. The ceramic part 111 is formed to have a flat plate shape. The ceramic part 111 is formed to have a rectangular cuboid shape. Furthermore, the ceramic part 111 is formed to have a quadrilateral shape in the top and bottom view. The quadrilateral shape may be a square, for example. The shape is not limited to a quadrilateral shape. For example, it can be circular. The ceramic part 111 shown in the drawings is rectangular in the top and bottom view.

The ceramic part 111 has connection regions connected to the connection part 112. The ceramic part 111 has the connection regions in the lateral faces. The entire lateral faces of the ceramic part 111 can be the connection regions. The outer edges of the upper face or the outer edges of the lower face of the ceramic part 111 are included in the connection regions. The upper face or the lower face of the ceramic part 111 are not included in the connection regions except for the outer edges.

The entire upper face or the entire lower face of the ceramic part 111 does not have to be included in the connection regions. Example of forms in which the entire upper face or the entire lower face is not included in the connection regions include the case in which the upper face or the lower face of the ceramic part 111 protrudes from the upper face or the lower face of the connection part 112.

The ceramic part 111 is formed by using a ceramic as a primary material. Examples of ceramics for use as the primary material include aluminum oxide, aluminum nitride, silicon oxide, yttrium oxide, zirconium oxide, magnesium oxide, or the like. Furthermore, the ceramic part 111 as a sintered body is formed.

The connection part 112 has an upper face, a lower face, outer lateral faces, and inner lateral faces. The connection part 112 is formed to have a flat plate shape with a through hole. The outer edges of the connection part 112 form a quadrilateral shape in the top or bottom view. The quadrilateral shapes include a square. The shape is not limited to a quadrilateral shape. For example, it can be circular.

The connection part 112 has connection regions connected to the ceramic part 111. The connection part 112 has the connection regions in the inner lateral faces. The entire inner lateral faces of the connection part 112 can be the connection regions. The lines shared by the upper face and the inner lateral faces, or the lines shared by the lower face and the inner lateral faces are included in the connection regions. The upper face or the lower face of the connection part 112, except for the lines shared by the inner lateral faces, is not included in the connection regions.

The entire upper face or the entire lower face of the connection face 112 does not have to be included in the connection regions. Examples of forms in which the entire upper face or the entire lower face is not included in the connection regions include the case in which the upper face or the lower face of the connection part 112 protrudes from the upper face or the lower face of the ceramic part 111.

The connection part 112 has stronger adhesion to a precious metal of the precious metal layer 120 than the ceramic part 111. At least in the surface on which the precious metal layer 120 is formed, the connection part 112 has stronger adhesion to a precious metal than the ceramic part 111. In other words, the connection part 112 is formed using a material or a shape that can facilitate adhesion to a precious metal as compared to the ceramic part 111. Facilitated adhesion in other words is less prone to delamination.

The connection part 112 is formed by using a ceramic as a primary material. Examples of ceramics for use as the primary material include aluminum oxide, aluminum nitride, silicon oxide, yttrium oxide, zirconium oxide, magnesium oxide, or the like. The connection part 112 does not have to use a ceramic as a primary material. For example, the connection part 112 can be formed by using a metal as a primary material. Metals such as Al, Fe, Ti, or the like have stronger adhesion to a precious metal than a ceramic.

The ceramic part 111 and the connection part 112 are integrally formed. The ceramic part 111 and the connection part 112 are formed as an integrated sintered body produced by integrally sintering the ceramic part 111 and the connection part 112. This can be achieved, for example, by integrally sintering a ceramic part 111 that is a sintered body and a granular material for forming a connection part 112. For the sintering method, for example, pressureless sintering, spark plasma sintering (SPS), hot pressing (HP), or the like can be used.

In the case of forming a ceramic part 111 and a connection part 112 using the same ceramic as a primary material, the connection part 112 is provided with higher porosity than the ceramic part 111. In other words, the connection part 112 is formed to contain more voids than in the ceramic part 111. Such a porosity difference can be adjusted by the sintering conditions (sintering temperature, sintering time, heating rate), the particle size of the material, the concentration of a sintering additive, or the like.

Higher porosity increases the protrusions and depressions associated with the voids in the surface of the connection part 112. The precious metal layer 120 can be formed with stronger adhesion to a surface having more protrusions and depressions than a surface having fewer protrusions and depressions. This is because a precious metal layer is formed as the precious metal penetrates the depressions. Accordingly, increasing the porosity of the connection part can enhance the adhesion to a precious metal.

Precious Metal Layer 120

A precious metal layer 120 is a metal layer formed by using a precious metal as a primary material. Alternatively, the precious metal layer 120 is a metal layer formed only with a precious metal. A metal layer formed only with a precious metal here refers to one having a precious metal content of at least 80%. The precious metal layer 120 can be an alloy containing a metal other than precious metals. The precious metals for forming the precious metal layer 120 include one or more elements selected among Pt, Au, Ag, Rh, or the like. For example, the precious metal layer 120 can be formed by using only Pt.

The precious metal layer 120 can be formed to have a thickness in the range of 5 nm to 500 nm. The precious metal layer 120 can have a thickness in excess of 500 nm. The precious metal layer 120 is preferably formed to have a thickness of 1000 nm at most.

Metal Layer 130

A metal layer 130 is formed using a metal as a primary material. For the primary material for the metal layer 130, a metal that is different from the primary material for the precious metal layer 120 is used. The metal layer 130 is formed using a material not included in the materials for forming the precious metal layer 120. Metal materials for forming the metal layer 130 include one or more elements selected among Ru, W, Al, Ti, Ni, or the like. For example, the metal layer 130 can be formed by using only Ru.

The metal layer 130 can be formed to have a thickness in the range of 50 nm to 1000 nm. The metal layer 130 can have a thickness in excess of 1000 nm. The metal layer 130 is preferably formed to have a thickness of 2000 nm at most.

Black Layer 140

A black layer 140 is a black colored layer. The black color here is defined as a color having a visible light reflectance of 30% at most, and a visible light absorption of at least 70%. For example, the black layer 140 can be formed by using only $RuO_2$. The black layer 140 can be formed to have a thickness in the range of 1 nm to 100 nm. The black layer 140 can be formed to have a thickness in excess of 100 nm.

A method of manufacturing a metal-coated member 1 will be explained next.

Figure 3A:
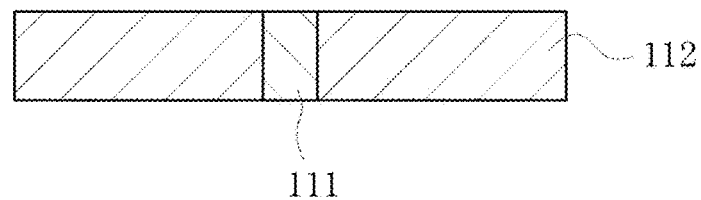
FIG. 3A is a cross-sectional view explaining a method of manufacturing a metal-coated member.

A composite ceramic member 110 is provided. FIG. 3A shows the state in which the composite ceramic member 110 has been provided. The composite ceramic member 110 can be provided by manufacturing one from a ceramic part 111 and a connection part 112. The composite ceramic member 110 can be provided by purchasing a composite ceramic member 110 instead of manufacturing it.

The composite ceramic member 110 can be manufactured, for example, by bonding a ceramic part 111 to a connection part 112 using an adhesive. Alternatively, as described above, the composite ceramic member 110 can be manufactured by integrally sintering a ceramic part 111 and a connection part 112.

Figure 3B:
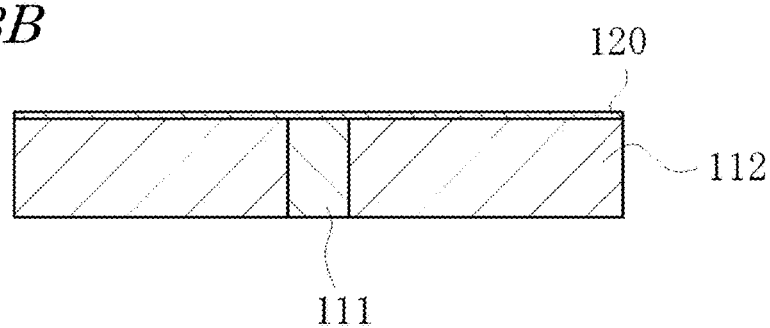
FIG. 3B is a cross-sectional view explaining the method of manufacturing a metal-coated member.

Subsequently, a precious metal layer 120 is disposed on the composite ceramic member 110. FIG. 3B shows the state after disposing a precious metal layer 120 on the composite ceramic member 110. The precious metal layer 120 is disposed on the surface of the composite ceramic member 110. The precious metal layer 120 is disposed on the upper face or the lower face of the composite ceramic member 110. The precious metal layer 120 can be disposed on not only the upper face or the lower face of the composite ceramic member 110, but also the lateral faces extended from the upper face or the lower face.

The precious metal layer 120 is disposed to extend across the ceramic part 111 and the connection part 112. The precious metal layer 120 is disposed on a surface of the composite ceramic member 110. The precious metal layer 120 is disposed on a portion of the surface of the composite ceramic member 110. The precious metal layer 120 is disposed on the surface region that includes a portion of the surface of the ceramic part 111 and a portion of the surface of the connection part 112.

The precious metal layer 120 is disposed on the connected area where two areas of different adhesion strengths relative to a precious metal are continuously located. The precious metal layer 120 is disposed on the connected area where two areas having different adhesion strengths relative to one or more precious metals selected among Pt, Au, Ag, and Rh are continuously located. The connected area includes an area having weak adhesion to the precious metal(s), and an area having strong adhesion to the precious metal(s). Because the ceramic part 111 and the connection part 112 have different adhesion strengths relative to the precious metals, the area that includes the ceramic part 111 and the connection part 112 is a connected area.

The precious metal layer 120 can be formed on the surface of the composite ceramic member 110 by, for example, sputtering. In the case of forming a precious metal layer 120 by sputtering on a ceramic sintered body containing a sufficient volume of voids, the precious metal layer 120 is formed by allowing the precious metal to penetrate the depressions provided according to the shapes of protrusions and depressions formed in the surface.

Figure 3C:
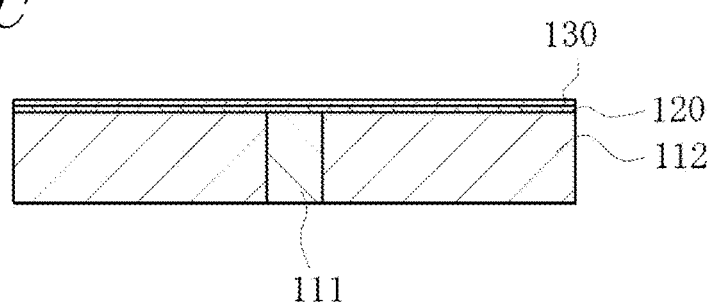
FIG. 3C is a cross-sectional view explaining the method of manufacturing a metal-coated member.

Subsequently, a delamination layer is disposed on the precious metal layer 120 that has been disposed on the composite ceramic member 110. FIG. 3C shows the state after disposing a delamination layer on the precious metal layer 120. In the metal-coated member shown in the drawings, the metal layer 130 is the delamination layer.

The delamination layer is disposed on the surface region. The delamination layer is disposed in the area where the precious metal layer 120 is disposed extending across the ceramic part 111 and the connection part 112. The delamination layer is disposed on the connected area. The delamination layer can be formed on the surface of the precious metal layer 120, for example, by sputtering. The delamination layer is formed by using a metal different from the precious metal(s) used to form the precious metal layer 120.

Figure 3D:
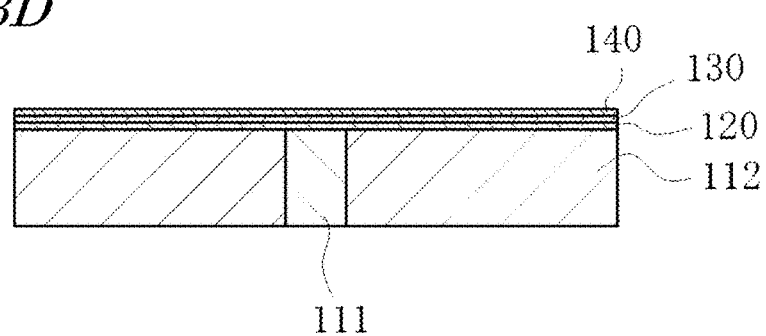
FIG. 3D is a cross-sectional view explaining the method of manufacturing a metal-coated member.

Then a black layer 140 is disposed on the delamination layer. FIG. 3D shows the state after forming a black layer 140 on the delamination layer. The black layer 140 is formed on at least a portion of the precious metal layer 120 and a portion of the delamination layer where the composite ceramic member 110 has strong adhesion to precious metals. The black layer 140 can be formed on the surface of the delamination layer by, for example, sputtering.

Subsequently, the precious metal layer 120 disposed on the surface of the ceramic part 111 is removed from the composite ceramic member 110 on which the precious metal layer 120 has been formed. This also removes the delamination layer and the black layer 140 disposed on the ceramic part 111 together with the precious metal layer 120.

Among the precious metal layer 120 disposed on the composite ceramic member 110, the precious metal layer 120 disposed on the surface of the ceramic part 111 delineated by the boundary between the ceramic part 111 and the connection part 112 is removed. Among the precious metal layer 120 disposed on the composite ceramic member 110, the precious metal layer 120 disposed on the surface of the connection part 112 is not removed. Accordingly, the delamination layer remains on the precious metal layer 120 disposed on the surface of the connection part 112. Among the precious metal layer 120 disposed on the connected area, only the precious metal layer 120 disposed on the area having weak adhesion to precious metals is removed.

The precious metal layer 120 is removed by taking advantage of the adhesion strength difference. For example, the precious metal layer 120 disposed on the ceramic part 111 can be removed by moving or vibrating the composite ceramic member 110 having the precious metal layer 120 formed thereon. Alternatively, for example, the precious metal layer can be removed by applying ultrasonic vibration or a thermal shock to the ceramic part 111 having the precious metal layer 120 formed thereon.

Because of its weak adhesion to a precious metal, the ceramic part 111 is not fully adhered to the precious metal at the time the precious metal layer 120 is disposed on the composite ceramic member 110. On the other hand, because of its strong adhesion to a precious metal, the connection part 112 is sufficiently adhered to the precious metal at the time the precious metal layer 120 is deposited. Because of this adhesion strength difference, only the precious metal layer 120 disposed on the surface of the ceramic part 111 is removed by an external force, such as vibration, ultrasonic vibration, or the like.

Figure 4A:
FIG. 4A is a TEM image of a metal-coated member manufactured.
Figure 4B:
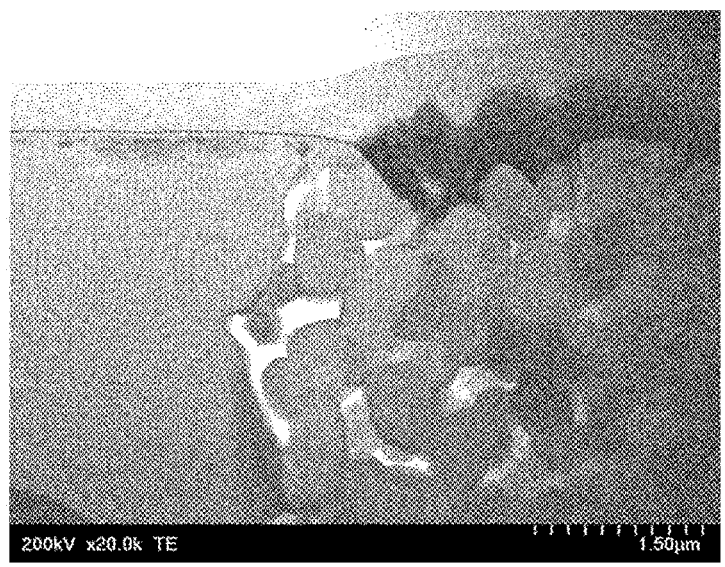
FIG. 4B is another TEM image of the metal-coated member manufactured.
Figure 4C:
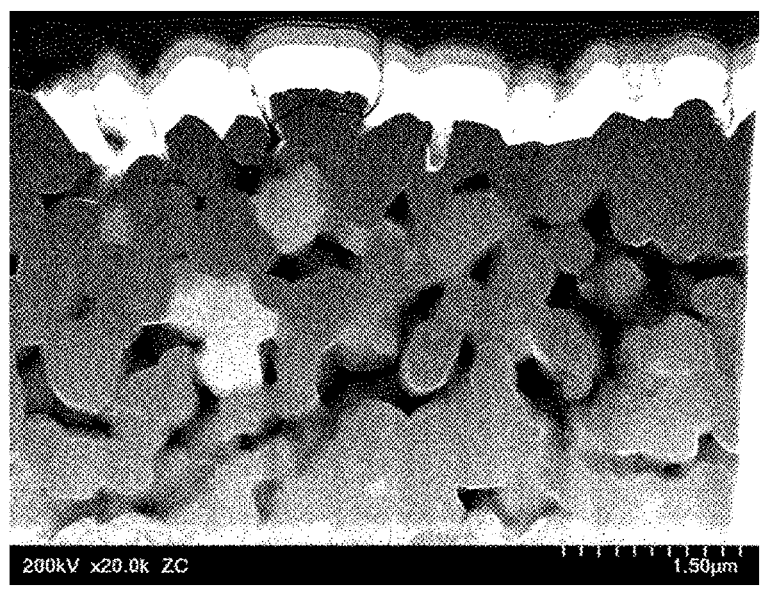
FIG. 4C is another TEM image of the metal-coated member manufactured.
Figure 4D:
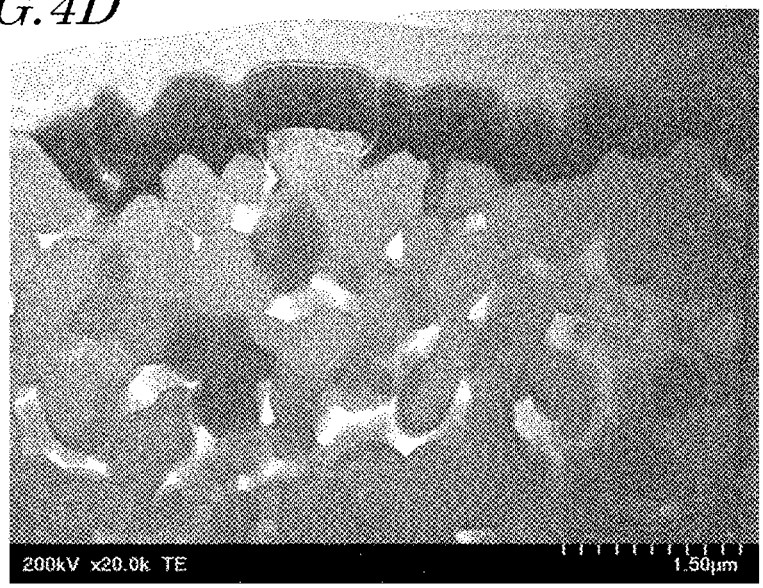
FIG. 4D is another TEM image of the metal-coated member manufactured.

FIG. 4A to FIG. 4D are TEM images of the metal-coated member 1 manufactured. FIG. 4A and FIG. 4C are scattered electron images, and the FIG. 4B and FIG. 4D are transmission electron images.

In the metal-coated member 1 from which these images were captured, the composite ceramic member 110 is an integrally sintered body composed of a ceramic part 111 formed of aluminum oxide as a primary material and a connection part 112 formed of aluminum oxide as a primary material. The composite ceramic member 110 was formed by adjusting the sintering conditions so as to achieve the porosity of the connection part 112 of about 10%. The thickness of the composite ceramic member 110 was 0.4 mm. For the precious metal layer 120, Pt was employed. For the delamination layer, Ru was employed. For the black layer 140, $RuO_2$ was employed. The layer forming rates were adjusted such that the thickness of each layer was 200 nm.

The TEM images in FIG. 4A and FIG. 4B show the area near the boundary between the ceramic part 111 and the connection part 112, analyzing near the surface where the precious metal layer 120 was disposed. The ceramic part 111 is shown on the left side of the images, and the connection part 112 is shown on the right side. A large number of voids are observed in the connection part 112, but no void is visually observed in the ceramic part 111. On the connection part 112 whose surface has protrusions and depressions created by the voids, a precious metal layer 120, a delamination layer, and a black layer 140 are formed.

As is understood from the images in FIG. 4A and FIG. 4B, the precious metal layer 120 is disposed on the surface having protrusions and depressions, but is removed from the area without protrusions and depressions. In other words, the precious metal layer 120 is formed on the surface of the connection part 112 along the boundary between the ceramic part 111 and the connection part 112. The areas with and without the precious metal 120 are clearly divided along the boundary between the areas with and without protrusions and depressions. In other words, the boundary between the areas with the precious metal layer 120 and the area without the precious metal layer 120 can be said to coincide with the boundary between the ceramic part 111 and the connection part 112. This demonstrates that the precious metal layer 120 was removed only from the ceramic part 111 with high precision.

In the surface where the precious metal layer 120 is disposed, the degrees of protrusions and depressions differ between the ceramic part 111 and the connection part 112. In the ceramic part 111, the surface roughness Rz (maximum height) of the surface on which the precious metal layer 120 is disposed is 0.05 μm at most. In the connection part 112, the surface roughness Rz of the surface on which the precious metal layer 120 is disposed is at least 0.10 μm. Such a surface roughness difference can result in a difference in the adhesion strengths relative to a precious metal that can be used to control the area to be provided with a precious metal layer.

According to this manufacturing method, the boundary between the area with the precious metal layer 120 and the area without the precious metal layer 120 can be established within 1000 nm of the boundary between the ceramic part 111 and the connection part 112. Or better yet, the boundary between the area with the precious metal layer 120 and the area without the precious metal layer 120 can be established within 100 nm of the boundary between the ceramic part 111 and the connection part 112. Or better yet, the boundary between the area with the precious metal layer 120 and the area without the precious metal layer 120 can be established within 50 nm of the boundary between the ceramic part 111 and the connection part 112. Or better yet, the boundary between the area with the precious metal layer 120 and the area without the precious metal layer 120 can be established at substantially the same position as the boundary between the ceramic part 111 and the connection part 112.

Here, it can be said that the degree at which the boundary between the area with the precious metal layer 120 and the area without the precious metal layer 120 coincides with the boundary between the ceramic part 111 and the connection part 112 is of high precision, but it is difficult to definitively affirm that there is no misalignment whatsoever. In this regard, it is stated here that the boundary is substantially at the same position. They appear to coincide with one another in FIG. 4A to FIG. 4D and is clearly achieved with high precision, but it is difficult to accurately quantify the coincidence. Here, it is described as "coincide" in the sense that it is substantially located at the same position.

The TEM images in FIG. 4 and FIG. 4D show the results of analyzing the area where the precious metal layer 120 was located. The left edge of FIG. 4C shows the area near the boundary between the ceramic part 111 and the connection part 112 in FIG. 4A. The precious metal layer 120, the delamination layer, and the black layer 140 are not distinguishable in FIG. 4C, but are recognizable in FIG. 4D.

As is understood from the images in FIG. 4C and FIG. 4D, the precious metal layer 120 is disposed on the surface of the protrusions and depressions to allow the precious metal layer 120 to enter the depressions, but does not enter the voids on the inside. Accordingly, it can be said that the enhancing factor for the adhesion to the precious metal layer 120 is not the voids themselves, but rather the protrusions and depressions in the surface. In other words, it is possible to enhance the adhesion to the precious metal layer 120 with any other method as long as it creates protrusions and depressions in the surface, even if the method does not create voids.

A metal-coated member 1 and a method of manufacturing the same have been described above. Even in the case in which a delamination layer is not formed, the precious metal layer 120 disposed on the surface of the ceramic part 111 can be removed. Thus, the process of removing the precious metal layer 120 can be performed without disposing a delamination layer. Disposing a delamination layer, however, facilitates the removal of the precious metal 120. In manufacturing a metal-coated member 1, the process of disposing a black layer 140 can be excluded.

The metal-coated member 1 can be utilized as an optical member, for example. When utilized as an optical member, the precious metal layer 120 can be used as a light shielding layer. For example, in the case in which the ceramic part 111 serves as the light emission region, a light shielding layer is conceivably disposed to reduce the leakage of light from the connection part 112. Examples of use of the metal-coated member 1 is not limited to this.

Light Emitting Device

A light emitting device 2 including a metal-coated member 1 as one of the constituent elements will be explained next. In the light emitting device 2, the metal-coated member 1 is utilized as a wavelength conversion member 280, which is an example of an optical member.

The light emitting device 2 has constituent elements including a base 210, a light emitting element 220, a submount 230, a light reflecting member 240, a protective device 250, a temperature measuring element 260, a wire 270, a wavelength conversion member 280, a light transmissive member 290, and a light shielding member 300. The light emitting device 2 at least includes a light emitting element 220 and an optical member.

The light emitting device 2 includes one or more light emitting elements 220. The light emitting device 2 includes as many submounts 230 as the light emitting elements 220, and as many light reflecting members 240 as the light emitting elements 220. The light emitting device 2 includes one or more protective devices 250. The light emitting device 2 includes one or more temperature measuring elements 260. The light emitting device 2 includes one or more wires 270.

Each constituent element of the light emitting device 2 will be explained next.

Base 210

A base 210 has a recessed shape recessed from the upper face towards the lower face. The periphery in the top view is quadrilateral shaped, and the recess is created inward of the periphery. The base 210 has an upper face 211, a bottom face 212, a lower face 213, and one or more inner lateral faces 214, and one or more outer lateral faces 215. In the top view, a frame is created by the one or more inner lateral faces 214 that meet the upper face 211. The recess of the base 210 is surrounded by the frame.

The base 210 has one or more stepped parts 216 inward of the frame. A stepped part 216 is defined by an upper face and a lateral face that meet the upper face and extends downward from the upper face. The one or more inner lateral faces 214 include the lateral face(s) that meet the upper face 211 of the base 210 and the lateral face(s) of the stepped part(s) 216.

The base 210 can be formed by using a ceramic as a primary material. For example, aluminum nitride, silicon nitride, aluminum oxide, or silicon carbide can be used as a ceramic. Without limiting it to ceramics, the base can be formed by using other insulating material(s) as a primary material.

On the bottom face 212 of the base 210, a metal layer is disposed at one or more locations. On the upper face of 211 of the base 210, a metal layer is disposed at one or more locations. The metal layer disposed at one or more locations of the bottom face 212 includes a metal layer electrically connected to the metal layer disposed on the upper face 211.

Light Emitting Element 220

A light emitting element 220 is a semiconductor laser element. It does not have to be a semiconductor laser element. For example, a light emitting element, such as a light emitting diode (LED), organic light emitting diode (OLED), or the like, can be employed as a light emitting element 220 in the light emitting device 2. In the light emitting device 2 illustrated in the drawings, a semiconductor laser element 20 is employed as a light emitting element 220.

The semiconductor laser element 20 illustrated in the drawings has a rectangular periphery in the top view. The lateral face meeting one of the two short sides of the rectangle serves as the emission end face through which the light exits from the semiconductor laser element 20. The upper face and the lower face of the semiconductor laser element 20 have larger areas than the emission end face.

The light (laser beam) emitted from a semiconductor laser element 20 spreads, forming an elliptical far field pattern (hereinafter referred to as "FFP") in a plane parallel to the emission end face. FFP represents the shape and light intensity distribution of the emitted light at a location distant from the emission end face.

The light emitted from a semiconductor laser element 20 forms in a plane parallel to the emission end face an elliptical FFP having a minor axis in the layer direction of the semiconductor layers including the active layer and a major axis in the stacking direction perpendicular to the layer direction. The layer direction will be referred to as the lateral direction of the FFP, and the stacking direction will be referred to as the vertical direction of the FFP.

The light having an intensity of at least $1/e^2$ relative to the peak intensity value based on the light intensity distribution of an FFP of a semiconductor laser element 20 will be referred to as the main portion of the emitted light. The angle corresponding to the full width at half maximum of the light intensity distribution will be referred to as the divergence angle of light emitted form a semiconductor laser element. The divergence angle in the vertical direction of an FFP will be referred to as vertical divergence angle, and the divergence angle in the horizontal direction of an FFP will be referred to as horizontal divergence angle.

For a light emitting element 220, one that emits light having a peak emission wavelength in the range of 320 nm to 530 nm, typically in the range of 430 nm to 480 nm, can be used. Examples of such a semiconductor laser element 20 include semiconductor laser elements including nitride semiconductors. For a nitride semiconductor, for example, GaN, InGaN, and AlGaN can be used. The light emitted from the light emitting element 220 is not limited to this.

Submount 230

A submount 230 is shaped as a rectangular cuboid having a lower face, an upper face, and lateral faces. The width of the submount 230 in the up/down direction is the smallest. The shape of the submount 230 is not limited to a rectangular cuboid. The submount 230 can be formed with, for example, silicon nitride, aluminum nitride, or silicon carbide. Other material(s) can be used. A metal layer is formed on the upper face of the submount 230.

Light Reflecting Member 240

A light reflecting member 240 has a light reflecting face 241 that reflects light. For the light reflecting face, a face having a reflectance relative to the peak wavelength of the irradiated light of at least 90% is provided. The reflectance here can be set as 100% at most, or less than 100%.

The light reflecting member 240 has a plurality of light reflecting faces 241. The plurality of light reflecting faces 241 include two light reflecting faces 241, each having a planar shape and being oblique to the lower face, forming different oblique angles with the lower face from one another. Neither of the two light reflecting faces 241 is perpendicular to, nor in parallel with the lower face as the positional relationship. The two light reflecting faces 241 are contiguous, forming an integrated reflecting region. The shape of a light reflecting face 241 is not limited to a planar shape, and can be, for example, a curved surface.

Glass or a metal can be used as a primary material to form the outer shape of the light reflecting member 240. A heat resistant material is suited for the primary material and, for example, glass such as quartz or BK7 (borosilicate glass), metals such as aluminum, or Si can be used. A light reflecting face can be formed by using, for example, a metal, such as Ag, Al, or the like, or a dielectric multilayer film, such as $Ta_2O_5/SiO_2$, $TiO_2/SiO_2$, $Nb_2O_5/SiO_2$, or the like.

Protective Device (250)

A protective device 250 prevents overcurrent from damaging a specific element such as a light emitting element. For the protective device 250, for example, a Zener diode composed of Si can be used.

Temperature Measuring Element 260

A temperature measuring element 260 is an element utilized as a temperature sensor for measuring the ambient temperature. For the temperature measuring element 260, for example, a thermistor can be used.

Wire 270

A wire 270 is used to electrically connect two constituent elements. A metal wire, for example, can be used as a wire 270.

Wavelength Conversion Member 280

A wavelength conversion member 280 is an example of a metal-coated member 1. The wavelength conversion member 280 has a wavelength conversion part 281, a light reflecting part 282, and a light shielding layer 283.

The wavelength conversion part 281 in the wavelength conversion member 280 corresponds to the ceramic part 111 in the metal-coated member 1. The light reflecting part 282 in the wavelength conversion member 280 corresponds to the connection part 112 in the metal-coated member 1. The light shielding layer 283 in the wavelength conversion member 280 corresponds to the precious metal layer 120 in the metal-coated member 1. Accordingly, descriptions similar to those for the ceramic part 111, the connection part 112, and the precious metal layer 120 are true for the wavelength conversion part 281, the light reflecting part 282, and the light shielding layer 283.

The wavelength conversion member 280 is formed by disposing a light shielding layer 283 on the surface of the base. The base of the wavelength conversion member 280 is formed by integrally forming a wavelength conversion part 281 and a light reflecting part 282. The base of the wavelength conversion member 280 corresponds to the composite ceramic member 110 in the metal-coated member 1. Accordingly, a description similar to that for the composite ceramic member 110 is true for the base of the wavelength conversion member 280. The wavelength conversion member 280 can further have a metal layer 130 or a black layer 140.

The wavelength conversion member 280 converts incident light into light having a different wavelength, and emits the converted light. The wavelength conversion member 280 emits a portion of the incident light. The wavelength conversion member 280 can convert incident light in its entirety into light of a different wavelength. In this case, the light incident on the wavelength conversion member 280 does not exit the wavelength conversion member 280.

The wavelength conversion part 281 converts the light incident on the wavelength conversion part 281 into light having a different wavelength. The wavelength conversion part 281 can be formed by using a ceramic as a primary material and a phosphor contained in the ceramic. It is preferable to use a material having a melting point of in the range of 1300° C. to 2500° C. as the primary material so as not to allow the wavelength conversion part 281 to be deformed or discolored by heat.

For example, the wavelength conversion part 281 can be formed by sintering a phosphor and a light transmissive material such as aluminum oxide. The phosphor content can be set to in the range of 0.05 vol % to 50 vol % relative to the total volume of a ceramic. Alternatively, for example, a ceramic composed substantially only of a phosphor made by sintering the phosphor powder can be used. The wavelength conversion part 281 can be formed with a single crystal phosphor. A single crystal phosphor has weak adhesion to a precious metal.

Examples of phosphors include cerium-activated yttrium aluminum garnet (YAG) based phosphor, cerium-activated lutetium aluminum garnet (LAG) based phosphor, europium- and/or chromium-activated nitrogen-containing calcium aluminosilicate ($CaO$—$Al_2O_3$—$SiO_2$) based phosphor, europium-activated silicate (($Sr,Ba)_2SiO_4$) based phosphor, α-SiAlON based phosphor, β-SiAlON based phosphor, or the like. Among them, a YAG phosphor that is highly heat resistant and allows for white light emission in combination with blue excitation light is preferably employed.

The light reflecting part 282 reflects the light emitted from the wavelength conversion part 281 towards the light reflecting part 282. The inner lateral faces of the light reflecting part 282 are in contact with the lateral faces of the wavelength conversion part 281. The light reflecting part 282 allows the light incident on the wavelength conversion part 281 or the wavelength-converted light by the wavelength conversion part 281 to be reflected off the inner lateral faces of the light reflecting part 282.

The light reflecting part 282 can be formed by using a ceramic as a primary material. The primary material is not limited to this, and a metal or a ceramic-metal composite material can be used. Examples of high reflectance ceramic materials include alumina ($Al_2O_3$).

It is preferable to use a high thermal conductivity material for the light reflecting part 282 to transfer the heat from the wavelength conversion part 281. The light reflecting part 282 formed of a high thermal conductivity primary material has a heat dissipating function to transfer the heat from the wavelength conversion part 281, and in this regard, can be considered as a heat dissipating member instead of a light reflecting part 282. Alumina ($Al_2O_3$) is a high thermal conductivity ceramic material.

Light is irradiated on the wavelength conversion part 281 and the light reflecting part 282, which form the base of the wavelength conversion member 280 when the light emitting device 2 is in operation. Accordingly, the base of the wavelength conversion member 280 is preferably formed with a photodegradation-resistant inorganic material as a primary material. The base of the wavelength conversion member 280 does not have to be an inorganic material.

Light Transmissive Member 290

A light transmissive member 290 has a lower face, an upper face, and lateral faces. The light transmissive member 290 has a light transmitting property to transmit light. Here, the light transmitting property means a light transmittance of at least 80%. The light transmissive member 290 has a base that is a rectangular cuboid shaped plate. The shape of the light transmissive member 90 is not limited to a rectangular cuboid.

The base of the light transmissive member 290 can be formed by using sapphire as a primary material. Sapphire is a material having a relatively high transmittance and a relatively high strength. As a primary material of the base of the light transmissive member 290, besides sapphire, for example, quartz, silicon carbide, or glass can be used.

Light Shielding Member 300

A light shielding member 300 is formed by using a resin having a light shielding property. Here, the light shielding property refers to the characteristic of not transmitting light, and the light shielding property can be achieved by utilizing absorbing and reflecting properties in addition to blocking light. This can be formed, for example, by having a resin contain a filler, such as a light diffusing material and/or a light absorbing material.

Examples of resins for forming the light shielding member 300 include epoxy, silicone, acrylate, urethane, phenol, BT resin, or the like. Examples of light absorbing fillers include dark colored pigments, such as carbon black or the like.

A light emitting device 2 manufactured by using these constituent elements will be explained next.

First, two light reflecting members 240 are disposed on the bottom face 212 of the base 210. The two light reflecting members 240 are respectively disposed on different metal layers to bond their lower faces to the bottom face 212 of the base 210. The two light reflecting members 240 are disposed to have point symmetry about a point SP (see FIG. 11). The two light reflecting members 240 in the top view are positioned such that the upper edges of their light reflecting faces 241 are in parallel with or perpendicular to the inner lateral faces 214 or the outer lateral faces 215 of the base 210.

Then a protective device 250 and a temperature measuring element 260 are disposed on the bottom face 212 of the base 210. The protective device 250 is disposed and bonded onto the metal layer on which one of the two light reflecting members 240 is disposed. The temperature measuring element 260 is disposed and bonded onto a different metal layer from those on which the two light reflecting members 240 are disposed.

Subsequently, two submounts 230 are disposed on the bottom face 212 of the base 210. The two submounts 230 are respectively disposed on different metal layers to bond their lower faces to the bottom face 212 of the base 210. The two submounts 230 are respectively disposed on the metal layers on which the light reflecting members 240 are disposed. The submounts 230 and the light reflecting members 240 can be disposed on different metal layers.

Then light emitting elements 220 are disposed on the submounts 230. In the light emitting device 2 illustrated in the drawings, semiconductor laser elements 20 are disposed on the submounts 230. The two semiconductor laser elements 20 are respectively disposed on the upper faces of different submounts 230 and their lower faces are bonded thereto. The two semiconductor laser elements 20 are disposed to have point symmetry about the point SP. In other words, the point of symmetry for the two semiconductor laser elements 20 coincides with the point of symmetry for the two light reflecting members 240. In the explanation hereinbelow, the point SP will be referred to as the point of symmetry.

The two semiconductor laser elements 20 in the top view are positioned such that their emission end faces are not in parallel with or perpendicular to the inner lateral faces 214 or the outer lateral faces 215 of the base 210. Accordingly, the two semiconductor laser elements 20 are not in parallel with or perpendicular to the upper edges of the light reflecting faces 241 either. In other words, the semiconductor laser elements 20 are disposed such that their emission end faces are oblique to the inner lateral faces 214 and the outer lateral faces 215 of the base 210 or the upper edges of the light reflecting faces 241 in the top view.

The light reflecting members 240 can be disposed obliquely instead of obliquely disposing the semiconductor laser elements 20. In other words, the semiconductor laser elements 20 can be disposed in parallel with or perpendicular to the inner lateral faces 214 or the outer lateral faces 215 of the base 210, while disposing the light reflecting members 240 so as not be in parallel with, or perpendicular to the same.

The light emitted from the emission end faces of the two semiconductor laser elements 20 irradiates the corresponding light reflecting members 240. A corresponding light reflecting member 240 is the light reflecting member 240 corresponding to the semiconductor laser element 20 disposed on the same metal layer on which the corresponding light reflecting member 240 is disposed. Each semiconductor laser element 20 is disposed such that at least the major portion of the light irradiates the corresponding light reflecting face 241.

Between each semiconductor laser element 20 and the corresponding light reflecting member 240, the semiconductor laser element 20 is positioned more distant from the point of symmetry than the light reflecting members 240. Accordingly, the light emitted from the semiconductor laser elements 20 advances in the direction towards the point of symmetry. At least one of the two light emitting elements 220 is positioned close to the temperature measuring element 260. In this manner, good measurements of the temperature of the light emitting element 220 can be taken.

In the light emitting device 2, the submounts 230 on which the light emitting elements 220 are mounted play the role as heat dissipating members to dissipate heat generated by the light emitting elements 220. The submounts 230 can simply be formed with a high thermal conductivity material in order to allow them to function as heat dissipating members. Forming the submounts with a material having a higher thermal conductivity than that of the bottom face of the base can achieve a higher heat dissipating effect.

The submounts 230 in the light emitting device 2 can play the role of adjusting the emission positions of the semiconductor elements 20. For example, a submount is used as a position adjusting member in the case of allowing the light advancing along the optical axis to be parallel the bottom face 212 while irradiating the light reflecting face 241 at a predetermined position.

Then a plurality of wires 270 for electrically connecting the light emitting elements 220, the protective element 250, and the temperature measuring element 260 are bonded. The metal layer disposed at several locations of the bottom face 212 of the base 210 is utilized for the electrical connection. This allows these elements to be electrically connected to an external power source via the metal layer on the upper face 211 of the base 210.

Subsequently, a light transmissive member 290 is disposed on or above the upper face of the base 210. The lower face of the light transmissive member 290 is joined to the base 210. The light transmissive member 290 is joined to the upper face of a stepped part 216 of the base 210. Joining the light transmissive member 290 to the base 210 creates a closed space in which the semiconductor laser elements 20 are disposed. As such, in the case of a light emitting device 2, the light transmissive member 290 can play the role of a lid. This closed space is formed to be a hermetically sealed space. Hermetically sealing the space can reduce dust such as organic substances being collected on the emission end faces of the semiconductor laser elements 20.

A wavelength conversion member 280 is disposed on or above the upper face of the light transmissive member 290. The wavelength conversion member 280 is joined to the light transmissive member 290. By the time the light transmissive member 290 is joined to the base 210, the wavelength conversion member 280 is already joined to the light transmissive member 290. Alternatively, the wavelength conversion member 280 can be joined to the light transmissive member 290 after joining the light transmissive member 290 to the base 210.

The major portion of the light emitted from each light emitting element 220 enters the light transmissive member 290. The light transmissive member 290 has light transmitting properties relative to the light emitted by a light emitting element 220. The major portion of the light also enters the wavelength conversion member 280. Furthermore, the major portion of the light enters the wavelength conversion part 281 of the wavelength conversion member 280. The major portion of the light enters the wavelength conversion member 280 after passing through the light transmissive member 290.

The wavelength conversion member 280 has, in the lower face, a light-incidence region where the major portions of the light enter, and a peripheral region. In the wavelength conversion member 280, the wavelength conversion part 281 constitutes the light-incidence region. The light from the light emitting elements 220 and/or wavelength-converted light exits the light emitting device 2 from the upper face of the wavelength conversion part 281. In other words, the upper face of the wavelength conversion part 281 serves as the light extraction face of the light emitting device 2.

A light shielding layer 283 is disposed on the upper face side of the wavelength conversion member 280. The light shielding layer 283 is disposed on the light extraction face side of the light emitting device 2. The light shielding layer 283 is disposed on the upper face of the light reflecting part 282. The boundary between the area with the light shielding layer 283 and the area without the light shielding layer 283 coincides with the boundary between the light reflecting part 282 and the wavelength conversion part 281 serving as the light extraction face. The light shielding layer 283 disposed with high precision using a precious metal layer 120 can reduce leakage of light from an area other than the wavelength conversion part 281, which is the light extraction face, thereby achieving a high quality light emitting device 2.

For example, in the mass production of the light emitting devices 2 or the wavelength conversion members 280, the shape of the wavelength conversion parts 281 made of a ceramic as a primary material can vary. The method according to the embodiment of the present disclosure can reduce the impact of such shape variation on the light shielding layer positioning accuracy as compared to a method of disposing a light shielding layer in a required region with the use of a metal mask or the like.

Furthermore, the light shielding layer 283 is preferably formed to have a thickness in the range of 50 nm to 500 nm. Forming the light shielding layer in this thickness range ensures the use of an appropriate amount of a precious metal, allowing it to fully function as a light shielding layer.

In the case of a wavelength conversion member 280 further including a black layer 140 on the light shielding layer 283, the light emitting device 2 can absorb the external light that advances towards the light emitting device 2 such as optical feedback. Such light is reflected off the light shielding layer 283 or the metal layer 130. Disposing a black layer 140 can reduce the reflection of such light.

Allowing the heat generated by wavelength conversion to be concentrated in a certain location readily reduces the conversion efficiency of the wavelength conversion part 281. Thus, the distribution of the light becoming incident on the wavelength conversion part 281 is preferably dispersed. For example, this can be achieved by not allowing the high intensity portions of the laser beams from the two laser semiconductor laser elements 20 to overlap. Such a control can be implemented by, for example, adjusting the light reflecting faces 241 of the light reflecting members 240.

The upper face of the light transmissive member 290 is larger than the lower face of the wavelength conversion member 280. In the top view, the upper face of the light transmissive member 290 surrounds the lower face of the wavelength conversion member 280. Alternatively, the upper face of the light transmissive member 290 surrounds the wavelength conversion member 280.

Subsequently, a light shielding member 300 is formed inward of the frame created by the upper face 211 of the base 210. The light shielding member 300 is formed to fill the gap between the base 210 and the wavelength conversion member 280. The light shielding member 300 can be formed, for example, by allowing a thermosetting resin to flow into the space and hardened with heat. Disposing the light shielding member 300 can reduce the leakage of light.

The light shielding member 300 is in contact with the inner lateral faces 214 of the base 210 that meet the upper face 211, the upper face(s) of the stepped part(s) 216 of the base 210, the lateral faces of the light transmissive member 290, the upper face of the light transmissive member 290, and the lateral faces of the wavelength conversion member 280. The light shielding member 300 does not reach the upper face of the wavelength conversion member 280. Even if the light shielding member 300 does reach the upper face of the light reflecting part 282, it does not reach the upper face of the wavelength conversion part 281. There is a case in which the light shielding member 300 may be difficult to shield light up to the boundary between the wavelength conversion part 281 and the light reflecting part 282 with high precision. In combination with the light shielding layer 283, leakage of light from areas other than the light extraction face can be hindered with high precision.

As described above, in one embodiment, a wavelength conversion member includes: a wavelength conversion part containing a phosphor; a light reflecting part connected to the wavelength conversion part; and a light shielding layer formed on a surface of the light reflecting part along a boundary between the wavelength conversion part and the light reflecting part. The light shielding layer is a precious metal layer. The surface of the light reflecting part delineated by the boundary has stronger adhesion to the precious metal than a surface of the wavelength conversion part.

In one aspect of such a wavelength conversion member, the wavelength conversion part may be constructed with a ceramic sintered body or a single crystal phosphor.

In another embodiment, a wavelength conversion member includes: a wavelength conversion part; a connection part comprising a ceramic as a primary material and connected to the wavelength conversion part; and a light shielding layer formed on a surface of the connection part along a boundary between the wavelength conversion part and the connection part. The light shielding layer is a precious metal layer. A surface roughness Rz of the surface of the connection part on which the precious metal layer is formed is at least 0.10 μm.

In another embodiment, a light emitting device includes: a light emitting element; a package in which the light emitting element is disposed; and a wavelength conversion member including: a wavelength conversion part, a connection part connected to the wavelength conversion part, and a light shielding layer formed on a surface of the connection part. The wavelength conversion member is directly or indirectly connected to the package. The light shielding layer is a precious metal layer formed on the surface of the connection part along a boundary between the wavelength conversion part and the connection part. The surface of the connection part delineated by the boundary has stronger adhesion to the precious metal than a surface of the wavelength conversion part.

In one aspect of such a light emitting device, the wavelength conversion member may further include a black layer on the light shielding layer disposed on the connection part.

In another aspect of such a light emitting device, the light shielding layer is provided on a face opposite a face on which the light emitted from the light emitting element becomes incident.

In another embodiment, a light emitting device includes: a light emitting element; a package in which the light emitting element is disposed; and a wavelength conversion member including: a wavelength conversion part, a connection part comprising a ceramic as a primary material and connected to the wavelength conversion part, and a light shielding layer formed on a surface of the connection part. The wavelength conversion member is directly or indirectly connected to the package. The light shielding layer is a precious metal layer formed on the surface of the connection part along a boundary between the wavelength conversion part and the connection part. A surface roughness Rz of the surface of the connection part on which the precious metal layer is formed is at least 0.10 μm.

Certain embodiments of the present invention have been described above, but the present invention is not limited to the structures of the embodiments discussed in the description. For example, the present invention is applicable to a device having a constituent not disclosed in any of the embodiments. A mere fact that there is a difference from any of the structures disclosed above would not provide any ground for the inapplicability of the present invention. From the standpoint of the minimum constituents for completing an invention, some constituent elements of the devices or members disclosed by the embodiments can be omitted.

This means that the embodiments of the devices disclosed in the description should be considered from not only the standpoint of completing an invention, but also the standpoint of disclosing logical constituents for an assumed form of use. While the described forms of use allow the device to function effectively, the application of an invention is not limited to any exemplary form of use.

In this regard, in the present invention (the scope of claims), there can be a case where the inclusion of all the constituent elements disclosed in one embodiment is not essential. For example, in the event that a certain constituent element of a device or member disclosed by any of the embodiments is not recited in a claim, we claim the applicability of the invention disclosed in the claim scope by recognizing the design flexibility for a person of ordinary skill in the art for such a constituent element through the use of an alternative, an omission, a shape change, a change in the materials employed, or the like, without limiting the claim to what is disclosed in the embodiment.

The metal-coated members and the light emitting devices disclosed with reference to the embodiments described above can be utilized in automotive headlights. In other words, an automotive headlight can be considered as an example of use to which the present invention is applied. Not being limited to this, the present invention can be utilized as the light sources of lighting fixtures, projectors, head-mounted displays, backlights for other displays, or the like. A metal-coated member according to the present invention can be utilized in a broad range of applications without being limited to these forms of use.

What is claimed is:

1. A light emitting device comprising:
   a light emitting element; and
   a metal-coated member disposed above the light emitting element and comprising:
   a first ceramic part having an upper surface and a lower surface, wherein the lower surface is a light-incidence surface configured to receive light from the light emitting element,
   a second ceramic part connected to the first ceramic part, the second ceramic part having an upper surface and a lower surface, wherein the first ceramic part and the second ceramic part are sintered together and form an integrated sintered body and
   a precious metal layer formed on the upper surface of the second ceramic part along a boundary between the first ceramic part and the second ceramic part, the precious metal layer comprising a precious metal,
   wherein a surface roughness Rz of the upper surface of the first ceramic part is 0.05 μm at most and a surface roughness Rz of the upper surface of the second ceramic part on which the precious metal layer is formed is at least 0.10 μm,
   wherein an adhesion between the upper surface of the second ceramic part and the precious metal is stronger than an adhesion between the upper surface of the first ceramic part and the precious metal, and
   wherein, in a top view, a boundary between an area of an upper surface of the precious metal layer and an area of the upper surface of the first ceramic part is within 100 nm of the boundary between the first ceramic part and the second ceramic part.

2. The light emitting device according to claim 1, wherein:
   a porosity of the second ceramic part is higher than a porosity of the first ceramic part.

3. The light emitting device according to claim 1, wherein the precious metal layer contains one or more precious metals selected from a group consisting of Pt, Au, Ag, and Rh.

4. The light emitting device according to claim 1, wherein:
   the upper surface of the second ceramic part has more protrusions and depressions than the upper surface of the first ceramic part.

5. The light emitting device according to claim 4, wherein:
   the precious metal layer is formed on the upper surface of the second ceramic part to allow the precious metal layer to enter the depressions of the upper surface of the second ceramic part.

6. The light emitting device according to claim 1, further comprising:
   a light transmissive member that supports the metal-coated member, wherein the precious metal layer is positioned on an opposite side to the light transmissive member with respect to the first ceramic part and the second ceramic part.

* * * * *